United States Patent
Leu et al.

(10) Patent No.: US 6,953,608 B2
(45) Date of Patent: Oct. 11, 2005

(54) SOLUTION FOR FSG INDUCED METAL CORROSION & METAL PEELING DEFECTS WITH EXTRA BIAS LINER AND SMOOTH RF BIAS RAMP UP

(75) Inventors: Pong-Hsiung Leu, Taoyuan (TW); Yu-Min Chang, Taichung (TW); Fang-Wen Tsai, Hsinchu (TW); Jo-Wei Chen, Hsinchu (TW); Wan-Cheng Yang, Jubei (TW); Chyi-Tsong Ni, HsinChu (TW)

(73) Assignee: Taiwan Semiconductor Manufacturing Co., Ltd., Taiwan (TW)

( * ) Notice: Subject to any disclaimer, the term of this patent is extended or adjusted under 35 U.S.C. 154(b) by 175 days.

(21) Appl. No.: 10/421,187

(22) Filed: Apr. 23, 2003

(65) Prior Publication Data

US 2004/0213921 A1 Oct. 28, 2004

(51) Int. Cl.[7] .................................................. H05H 1/24
(52) U.S. Cl. ........................ 427/576; 427/578; 427/99; 438/787
(58) Field of Search ................................ 427/576, 578, 427/99

(56) References Cited

U.S. PATENT DOCUMENTS

| | | | |
|---|---|---|---|
| 5,937,323 A | 8/1999 | Orczyk et al. | |
| 6,291,028 B1 * | 9/2001 | Gupta et al. | 427/564 |
| 6,300,672 B1 | 10/2001 | Lee | |
| 6,303,519 B1 * | 10/2001 | Hsiao | 4383/758 |
| 6,319,814 B1 | 11/2001 | Tsai et al. | |
| 6,380,066 B1 | 4/2002 | See et al. | |
| 6,410,106 B2 | 6/2002 | Tsai et al. | |
| 6,583,064 B2 * | 6/2003 | Wicker et al. | 438/710 |
| 6,719,885 B2 * | 4/2004 | Lin et al. | 204/192.32 |
| 6,802,944 B2 * | 10/2004 | Ahmad et al. | 204/192.23 |
| 6,808,748 B2 * | 10/2004 | Kapoor et al. | 427/255.31 |

* cited by examiner

Primary Examiner—Bret Chen

(57) ABSTRACT

A HDP CVD process for depositing a USG liner followed by a FSG dielectric layer on a metal line pattern is described. The substrate is heated in a chamber with a plasma comprised of Ar and $O_2$. A USG liner is deposited in two steps wherein the first step is without an RF bias and the second step is with a moderate RF bias that does not damage the metal lines or an anti-reflective coating on the metal. The moderate RF bias is critical in forming a sputtering component that redeposits USG to form more uniform sidewalls and better coverage at top corners of metal lines. The USG deposition process has a good gap filling capability and significantly reduces device failure rate by preventing corrosion of metal lines during subsequent thermal process cycles. The method also includes a PECVD deposited FSG layer that is planarized to complete an IMD layer.

25 Claims, 4 Drawing Sheets

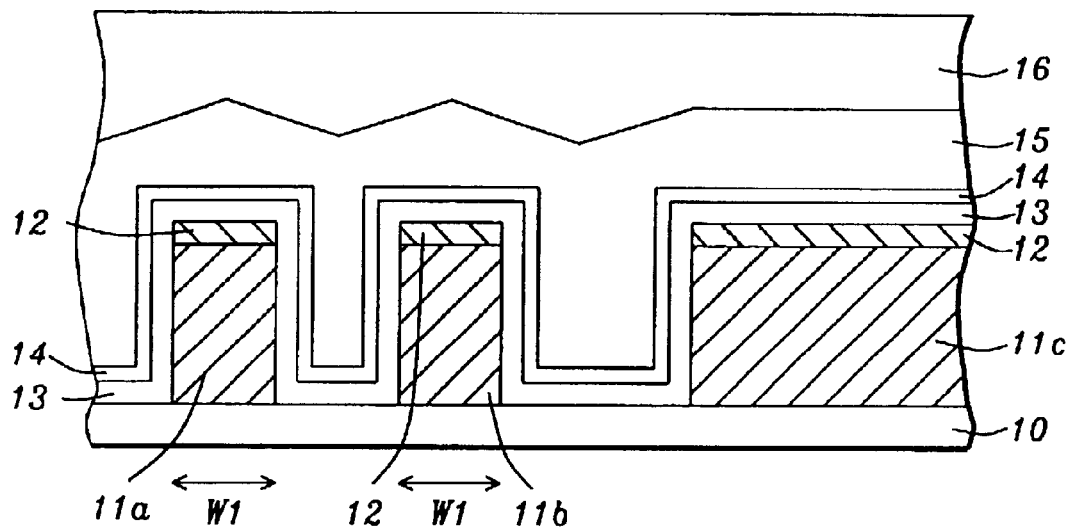
FIG. 1 – Prior Art
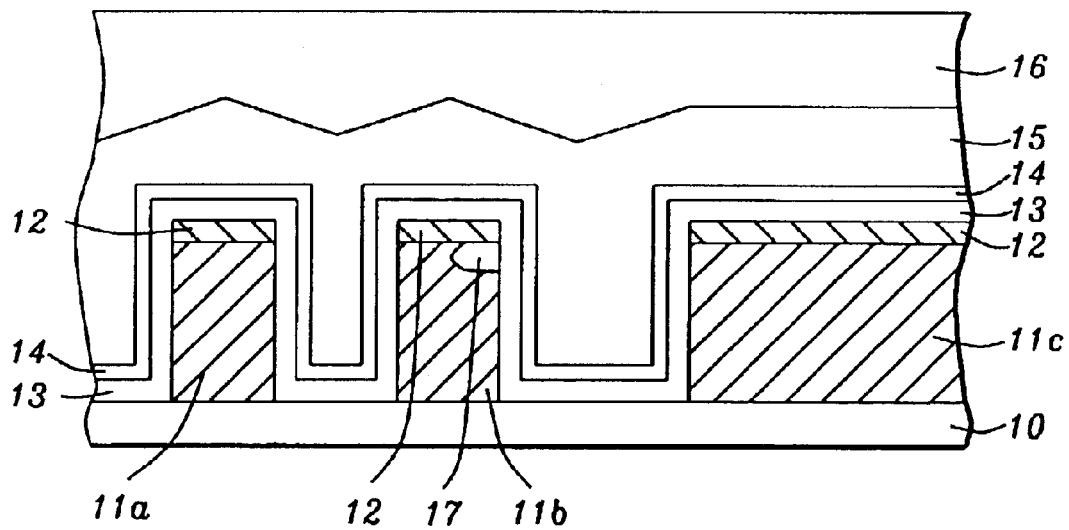
FIG. 2 – Prior Art

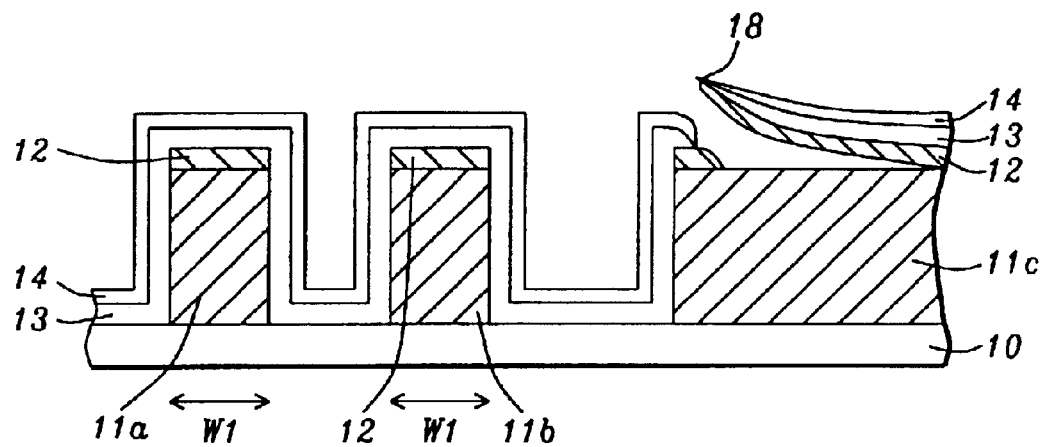
FIG. 3 – Prior Art
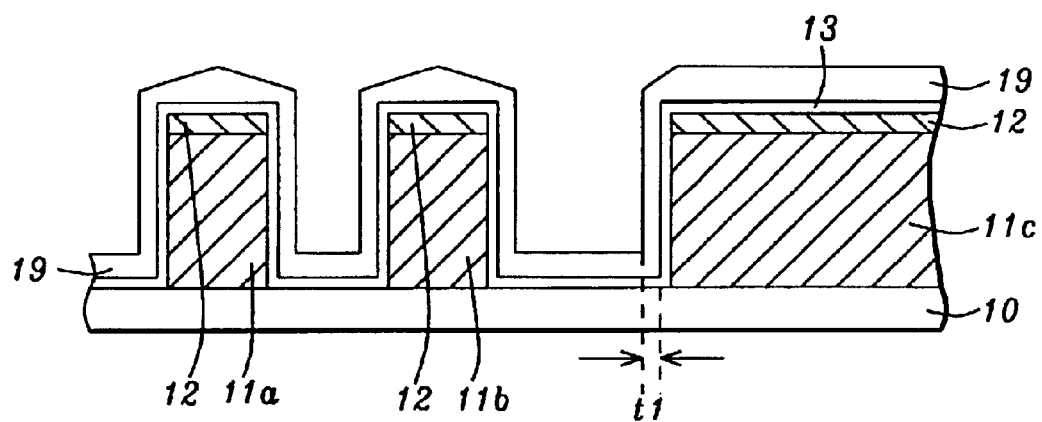
FIG. 4

SOLUTION FOR FSG INDUCED METAL CORROSION & METAL PEELING DEFECTS WITH EXTRA BIAS LINER AND SMOOTH RF BIAS RAMP UP

FIELD OF THE INVENTION

The invention relates to the field of fabricating integrated circuits and other electronic devices and in particular to an improved method of depositing an oxide liner over a metal pattern that prevents damage from ion bombardment and which protects the metal from corrosive agents.

BACKGROUND OF THE INVENTION

An integrated circuit device is comprised of several layers of metal that are separated by insulating layers also called intermetal dielectric (IMD) layers. Contact or via holes are formed in the IMD layers and are filled with a conductive material to connect one metal layer with another. A popular material for an IMD layer is silicon oxide with a dielectric constant (k) equal to about 4. However, with the constant need to reduce the size of metal interconnects in order to provide devices with higher performance, a dielectric layer having a lower k value is necessary. A material with a lower dielectric constant will be more effective in preventing capacitance coupling or crosstalk between metal lines. Fluorine doped $SiO_2$ or fluorosilicate glass (FSG) has a k value of about 3.5 or slightly less depending on the fluorine content. Therefore, newer technologies are incorporating FSG as a preferred dielectric layer.

Implementing FSG in a manufacturing scheme is not done without reliability issues. FSG films have a tendency to absorb water that can be released in later stages of fabrication and cause corrosion in adjacent metal features. Moreover, loosely held fluorine can diffuse out of the dielectric layer and form HF which then attacks metal such as copper, aluminum or tungsten to cause metal corrosion that degrades device performance. Several manufacturers have added an oxide liner between an FSG layer and a metal feature to prevent fluorine from attacking the metal.

For example, in U.S. Pat. No. 6,380,066, a double layer of oxide is employed to protect a metal plug from an FSG layer. Two oxide layers are deposited on a first layer of metal before FSG is deposited and a metal plug is formed in an oxide layer.

U.S. Pat. Nos. 6,319,814 and 6,410,106 to UMC stress the importance of process conditions in forming an FSG layer. Generally, a high density plasma (HDP) chemical vapor deposition (CVD) or plasma enhanced chemical vapor deposition (PECVD) technique is used to deposit an FSG film. These patents claim that an HDP CVD process with no RF bias and no ion bombardment coupled with no backside cooling on the wafer chuck enables an FSG layer to be formed that is resistant to water uptake. In addition, improved adhesion and film uniformity on a silicon nitride or silicon oxynitride etch stop layer in a damascene structure is observed.

U.S. Pat. No. 6,300,672 mentions the use of a silicon oxynitride (SiON) cap on FSG to protect an overlying metal layer. The key feature is that SiON functions both as an anti-reflective (ARC) layer and as a barrier to fluorine diffusion since it is a denser material than the oxide matrix which contains fluorine.

U.S. Pat. No. 5,937,323 states that the sequence prior to flowing fluorine in a FSG deposition is critical. A heated wafer with a surface temperature above 100° C. combined with a low gas deposition flow and low RF power form a 200 Angstrom FSG film with tightly bound fluorine on an undoped silicate glass (USG) liner. The USG liner and tightly bond fluorine prevent any fluorine attack on an underlying metal layer. This process also features top and side gas flows and top and side RF generators but a bias RF power is not applied during the FSG process.

A defect that can occur during deposition of a USG layer, especially with a high ion bombardment associated with a high RF bias, is peeling of a metal anti-reflective coating (ARC) such as TiN that is located above a metal line. Thus, an improved process is needed for a USG liner that offers better protection from corrosion to metal lines and which avoids high ion bombardment that can affect adhesion of an ARC above a metal line. The method should have a good gap filling capability and be compatible with existing tools and materials.

SUMMARY OF THE INVENTION

An objective of the present invention is to provide an improved method of forming an oxide liner which will prevent fluorine or HF that diffuses out of a dielectric layer from attacking a metal feature on a substrate to cause corrosion. The oxide deposition process should not damage metal lines during the deposition process.

A further objective of the present invention is to provide a method of depositing a USG liner that will not damage underlying anti-reflective layers such as TiN.

A still further objective of the present invention is to provide a method of depositing a USG layer that has good gap filling capability.

These objectives are achieved by forming an extra thickness of USG liner in an HDP CVD process that involves a smooth RF bias ramp up. A FSG layer is subsequently deposited in the same chamber in an integrated flow process. First, a substrate is provided with metal lines formed thereon. The metal line pattern typically includes an area where lines are separated by spaces that have a width similar to the line widths and an area having a larger metal line that can have a width several times the size of the smaller line widths. An anti-reflective coating (ARC) such as TiN is formed on the metal lines by a conventional method and a silicon rich oxide is then formed on the ARC and on the sidewalls of the metal lines.

A USG liner is deposited on the substrate in a process chamber by first heating the substrate in an oxygen and argon plasma with no RF bias. Next, a silane flow is started while top and side RF power enables a first USG layer to be formed during a short period when there is no RF bias. In the following short interval, the RF bias is ramped to a moderate level which results in deposition of a second USG layer. The sputtering component introduced by the RF bias redeposits the USG layers to form more uniform sidewalls that provide a better coverage at top corners of metal lines. At the start of the next step, the RF bias is ramped to a higher level and $SiF_4$ flow begins. The main FSG deposition then occurs while the RF bias is maintained at a high level and $SiF_4$ flow is increased. The Ar, $O_2$, and silane flow rates as well as the top and side RF power remain steady during all the USG and FSG deposition steps. Finally, the plasma is stopped and the substrate is removed.

A PECVD process is then employed to deposit another layer of FSG above the HDP FSG layer. The PECVD deposition affords a thicker IMD layer that can be polished by a chemical mechanical polishing (CMP) step to form a planar IMD layer.

BRIEF DESCRIPTION OF THE DRAWINGS

FIG. 1 is a cross-sectional view depicting a sequence of layers formed on a metal line pattern according to a prior art method.

FIG. 2 is a cross-sectional view showing a corrosion defect in a device fabricated by the prior art method depicted in FIG. 1.

FIG. 3 is a cross-sectional view showing metal peeling (roll defect) in a device fabricated by a prior art method depicted in FIG. 1.

FIGS. 4–5 are cross-sectional views illustrating a method of forming an undoped silicon glass layer and a FSG dielectric layer on a metal line pattern according to an embodiment of the present invention.

DETAILED DESCRIPTION OF THE INVENTION

Figure 5:
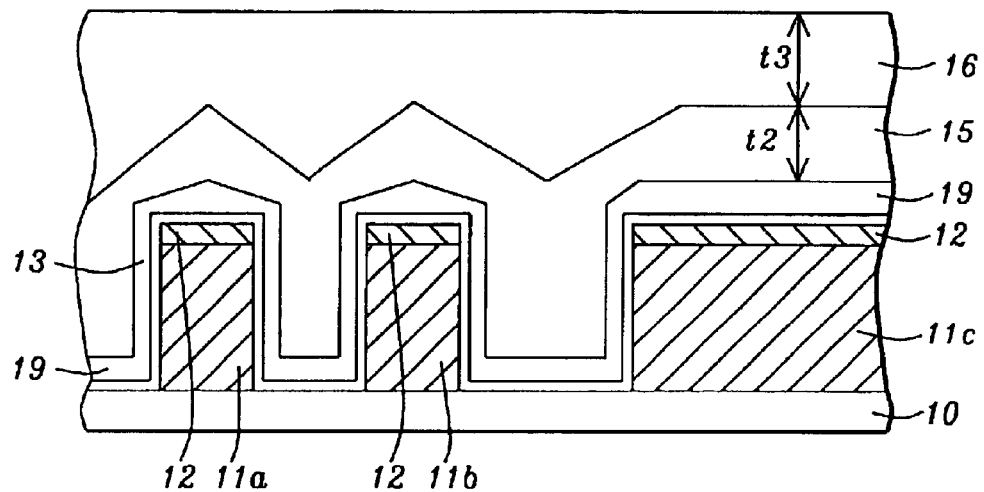

The present invention is particularly useful for forming an oxide liner over a metal pattern and an intermetal dielectric layer in a multi-level metallization scheme.

Referring to FIG. 1, in related art practiced by the inventors, a substrate 10 is provided with metal lines 11a, 11b, 11c consisting of an Al/Cu alloy formed thereon. Substrate 10 typically has active and passive devices that are not shown in order to simplify the drawing. A TiN anti-reflective layer 12 is formed on metal lines 11a, 11b, 11c by a conventional method and has a thickness in the range of about 3000 to 10000 Angstroms. Next, a PECVD method is used to deposit a silicon rich oxide (SRO) liner 13 having a thickness of about 300 Angstroms. A HDP CVD process without an RF bias forms an undoped silicon glass (USG) liner 14 that is about 200 Angstroms thick. In the same process chamber, a FSG layer 15 with a thickness between about 4000 and 20000 Angstroms is deposited by a HDP CVD process that has good gap fill capability. Finally, a second FSG layer 16 that is from 5000 to 20000 Angstroms thick is deposited by a PECVD step that has a higher deposition rate than the HDP CVD step.

Referring to FIG. 2, the SRO liner 13 typically provides poor corner coverage at top corners of metal lines 11a, 11b, 11c so that loosely bound fluorine from the FSG layer 15 can readily attack through the thin SRO liner 13 and through the thin USG layer 14 in later thermal cycles and cause metal corrosion defect 17 at the metal sidewall. The corrosion defect 17 is a serious concern since this type of defect can cause a failure rate as high as 28% in the resulting device.

Furthermore, the FSG layer 15 deposition involves a rapid RF bias ramp from 0 to over 500 W that produces high ion bombardment on the underlying TiN ARC 12 layer. As a result, TiN layer 12 adhesion to metal lines 11a, 11b, 11c suffers and the TiN layer 12 tends to peel and curl at the edges to form roll type defects 18 shown in FIG. 3. Roll type defects 18 can affect a large surface area and also detract from device yield.

The inventors have found that a method described in the first embodiment of the present invention is highly effective in reducing corrosion defects 17 and in eliminating the roll type defects 18 described above. The method is illustrated in FIGS. 4–6b.

Referring to FIG. 4, a substrate 10 is provided that is typically silicon but can also be based on silicon-germanium, gallium-arsenide, or silicon-on-insulator (SOI) technology. The substrate 10 normally contains dielectric, conductive, and semiconductive layers and devices that are not shown in order to simplify the drawing. A metal pattern that includes lines 11a, 11b, 11c is formed on substrate 10 by a well known method and is usually comprised of copper, aluminum, Al/Cu alloy, or tungsten. Metal lines 11a, 11b typically have a width $w_1$ near the minimum feature size of the device which in this case is about 150 nm to 180 nm (1500 to 1800 Angstroms) and a thickness from about 3000 to 10000 Angstroms. However, the invention is also applicable to smaller feature sizes for advanced technologies. In this example, a metal line 11c is provided which has a width greater than $w_1$ and which can subsequently be connected to an overlying metal layer by a metal via (not shown). However, the invention is not limited by the type of metal pattern and any design that includes metal lines 11a, 11b is applicable.

An ARC layer 12 preferably comprised of TiN with a thickness from about 200 to 1000 Angstroms is formed on top of metal lines 11a, 11b, 11c by a conventional method. The ARC 12 controls reflectivity and provides a larger process window during later lithography steps. ARC layer 12 may also be comprised of an alternative material such as TaN, TiW, TaSiN, Ti, or silicon oxynitride (SiON). Next, a PECVD method is used to deposit an SRO liner 13 having a thickness between 100 and 1200 Angstroms and preferably about 300 Angstroms. A USG layer 19 is deposited on SRO liner 13 by a HDP CVD process. Note that the USG layer 19 thickness $t_1$ on sidewalls of metal lines 11a, 11b, 11c may be thinner than the USG layer 19 on top of the same metal lines because the vertical deposition rate in the HDP CVD process is greater than the horizontal deposition rate.

Figure 7:
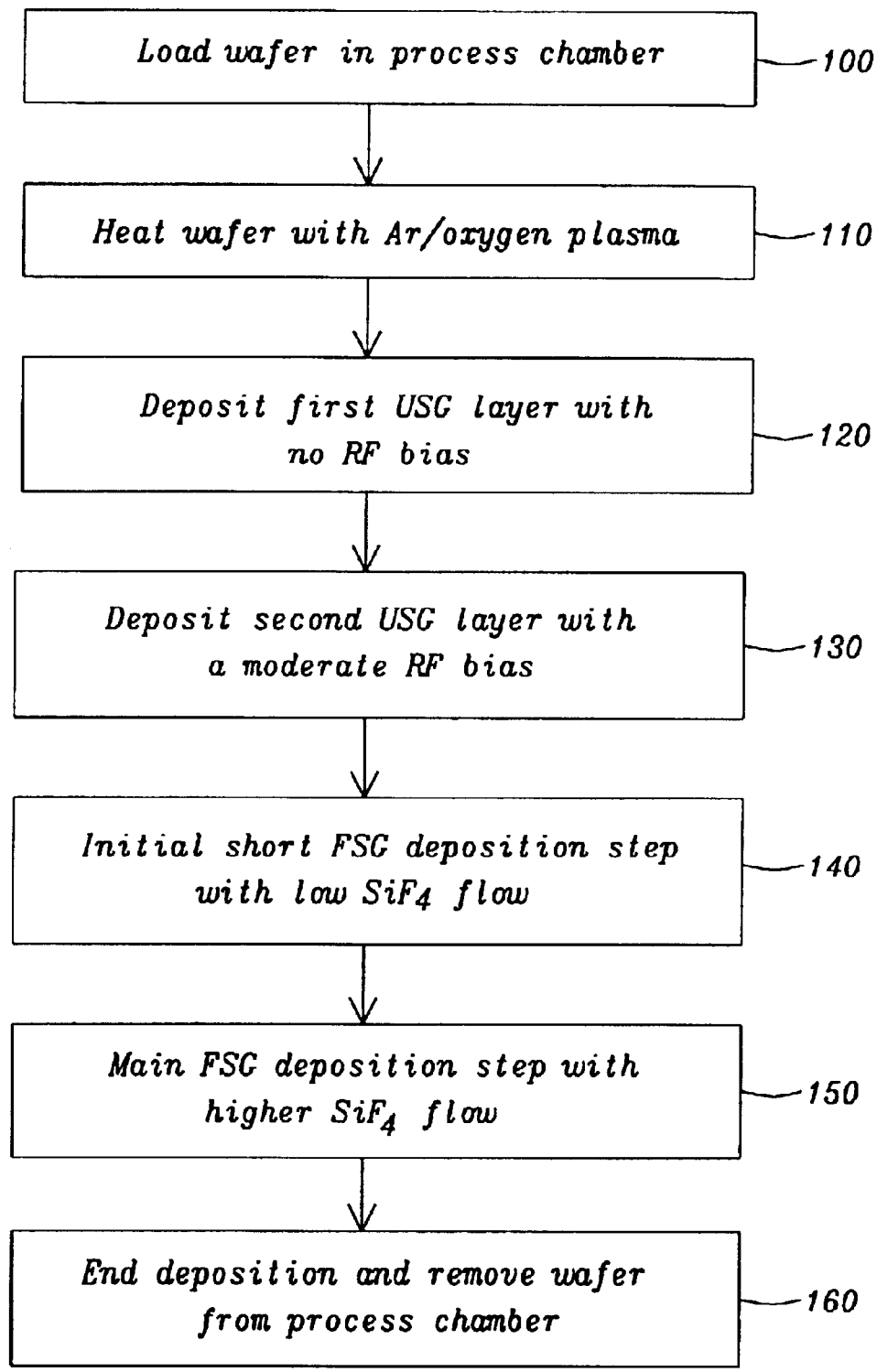
FIG. 7 is a flow diagram showing the key steps during deposition of the USG liner and HDP FSG layer in an integrated process sequence.

A key feature of the invention is formation of USG layer 19 and FSG layer 15 illustrated in FIG. 5 in an integrated HDP CVD process that is shown in FIG. 7. In step 100 of FIG. 7, the substrate 10 (hereafter referred to as a wafer) with a pattern comprised of metal lines 11a, 11b, 11c is positioned in a process chamber (not shown). Step 100 normally includes placing the wafer 10 on an electrostatic chuck (e-chuck) and evacuating the chamber to a predetermined reduced pressure by applying a vacuum. The chamber contains top and side coils for generating a top and side RF power, respectively. The chamber also has top and side gas nozzles for flowing gases into the chamber from the top or side. In addition, there is an RF bias system that can guide the plasma in the direction of the wafer.

In step 110, a plasma is applied to heat the wafer 10 preferably for a 70 second period although higher or lower times are acceptable depending on the desired wafer 10 temperature. Typically, the desired temperature is from about 300° C. to 450° C. and preferably is about 420° C. The plasma is generated with a top RF power of 1300 Watts and a side RF power of 3100 Watts at approximately 6 mTorr pressure and with an Ar top flow rate of 16 standard cubic centimeters per minute (sccm), an Ar side flow rate of 110 sccm, and an $O_2$ side flow rate of 126 sccm. There is no RF bias power at this point in the process.

Referring to step 120 in FIG. 7, conditions include a top RF power of from 500 W to 2000 Watts and preferably about 1300 Watts, a side RF power from about 2000 W to 4000 W and preferably about 3400 Watts for a period of 3 seconds. The time period may vary from about 2 to 10 seconds although a time longer than 3 seconds is not desirable because a thicker USG 19 layer will result that causes an increase in the dielectric constant of the final IMD layer. During step 120, the chamber pressure is from 3 to 50 mTorr and preferably about 5 mTorr and there is a silane flow from 20 to 200 sccm and preferably about 40 sccm from a side nozzle and from 1 to 10 sccm and preferably about 3 sccm from a top nozzle in the chamber. The Ar side flow rate is between 20 to 80 sccm and preferably about 40 sccm while the Ar top flow rate is from 2 to 20 sccm and preferably about 5 sccm. The side flow rate for $O_2$ is from 80 to 120 sccm and preferably is about 100 sccm. There is no RF bias power at this stage of the process. As a result, there is no intense ion bombardment that could damage metal lines 11a, 11b, 11c or cause ARC layer 12 to peel and form a roll type defect 18 as shown by a prior art method in FIG. 3. A first USG layer 19 having a thickness of about 30 to 100 Angstroms is deposited on SRO layer 13 in step 120.

Another key aspect of this invention is found in step 130 in FIG. 7 in which the USG deposition is extended for an additional three seconds during which an RF bias is applied to deposit a second USG layer of from 100 to 500 Angstroms on layer 19. The USG layers deposited without and with an RF bias are not distinguishable from one another and are collectively depicted as USG layer 19. The USG layer 19 may have a greater thickness above TiN layer 12 than on sidewalls of metal lines 11a, 11b, 11c since the vertical deposition rate is typically higher than the horizontal deposition rate. During step 130, the top RF power and side RF power remain the same as in step 120. In addition, the Ar, $O_2$, and silane flow rates and chamber pressure are unchanged from step 120. However, the RF bias is increased to a moderate range of 500 to 2000 Watts and preferably to 1200 Watts at the start of step 130 which is a low enough power to avoid damage to underlying metal layers 11a, 11b, 11c and to ARC layer 12.

Figure 6A:
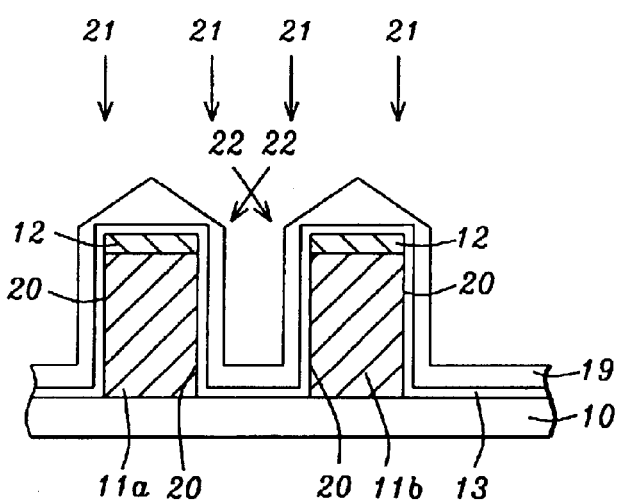
FIGS. 6a and 6b are cross-sectional views showing how the sputtering component of the present invention redistributes the USG layer to provide improved top corner coverage on metal lines.
Figure 6B:
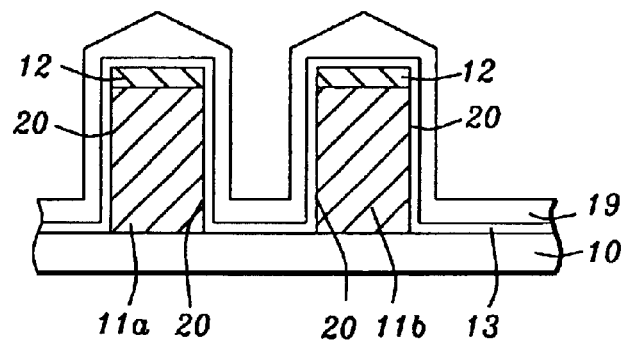

Referring to FIG. 6a, the RF bias power in step 130 introduces a sputtering component 22 into the plasma deposition 21 that is useful in redepositing the USG layer 19 as it is forming to provide a more uniform sidewall on metal lines 11a, 11b, 11c. This redeposition is critical in forming a thicker USG layer 19 on sidewalls 20 of metal lines 11a, 11b, 11c where attack by fluorine or fluorine by-products such as HF occurred in a prior art method shown in FIG. 2. The redistributed USG layer 19 is illustrated in FIG. 6b and has sidewalls that extend above the sidewalls 20 of metal lines 11a, 11b and above sidewall 20 of 11c (not shown) to provide a thicker layer of USG 19 on sidewalls 20.

Referring again to FIG. 5, the inventors have found that the extra thickness of USG layer 19 during step 130 in FIG. 7 combined with a redistribution of USG layer 19 is essential in protecting metal layers 11a, 11b, 11c from corrosion after an overlying layer of FSG 15 is deposited in a subsequent step. The extra USG layer 19 thickness is especially valuable at top corners of metal lines 11a, 11b, 11c in preventing corrosion which occurs in prior art methods.

Returning to FIG. 7, the HDP CVD process flow is continued in step 140 in a 3 second interval during which the chamber is prepared for FSG deposition. Top RF power, side RF power, chamber pressure and flow rates for silane, Ar, and $O_2$ are the maintained in the same range in step 140 as described for steps 120, 130. At the beginning of step 140, a $SiF_4$ flow rate from a side nozzle is started at 5 sccm and RF bias is increased to a range of 2000 to 3000 Watts and preferably to about 2500 Watts which starts to deposit a lightly doped FSG layer 15. The redeposition of USG layer 19 on sidewalls 20 also continues during step 140. The plasma sputtering component in step 140 improves the USG gap filling ability similar to step 130.

Referring to step 150 in FIG. 7, FSG layer 15 is deposited during a 110 second interval that can be adjusted to shorter or longer times depending on the desired thickness of FSG layer 15. Preferred conditions for the top and side RF power, chamber pressure, and flow rates for silane, Ar, and $O_2$ are the same as in steps 120, 130, 140. However, $SiF_4$ flow rate is increased to a range of 20 to 40 sccm and preferably to about 30 sccm from a side nozzle to promote deposition of FSG layer 15. RF bias is increased slightly in the range of 2000 to 3000 Watts and preferably to about 2900 Watts to provide a good gap filling capability. In this case, the sputtering component during the plasma deposition enables the sidewalls of FSG layer 15 on metal lines 11a, 11b, 11c to remain nearly vertical by removing some of FSG layer 15 near the top corners of the metal lines as FSG is being deposited which prevents the tops of two adjacent sidewalls from joining together and forming an unwanted air pocket or void. A void (not shown) can easily occur in narrow gaps such as in the space between metal lines 11a and 11b if process conditions are not controlled.

In step 160 shown in FIG. 7, the plasma deposition is stopped and a standard process known to those who practice the art is followed for removing the wafer. The process steps comprise purging toxic gases from the chamber, increasing the chamber pressure to match atmospheric pressure, and turning off the e-chuck so that the wafer can be released.

Returning to FIG. 5, the final thickness $t_2$ of FSG layer 15 is between about 4000 and 20000 Angstroms above the flat portion of USG layer 19 on metal line 11c. Next, a PECVD deposition is performed to form a second FSG layer 16 with a thickness $t_3$ between about 5000 and 20000 Angstroms above the flat portion of FSG layer 15 on metal line 11c. Second FSG layer 16 is thick enough to afford a thick IMD layer that can be polished by a CMP process to complete the formation of a planar IMD layer comprised of FSG layers 15, 16, USG layer 19, and SRO layer 13.

The method of the present invention is found to be effective in reducing the device failure rate due to metal corrosion from 28% to less than 1% and in eliminating the roll type defects resulting from TiN peeling as depicted in FIG. 3. The method is compatible with a high throughput manufacturing scheme since the biased USG layer 19 deposition (step 130) and deposition of FSG layer 15 are accomplished in a single integrated HDP CVD process. A smooth ramp in RF bias as described for this method is an advantage over prior methods that employ a quick ramp to 2500 Watts RF bias which can damage metal lines and a top ARC such as TiN. A smooth RF bias ramp is also preferred over no RF bias since the sputtering component from RF bias provides more uniform USG sidewalls that extend above top corners of metal lines and thereby offers better coverage of metal lines. Furthermore, the extra thickness of USG layer 19 from the RF biased deposition (step 130) that protects metal lines from HF is also effective in preventing trace quantities of water or other small molecules in FSG layer 15 from diffusing to metal lines 11a, 11b, 11c and causing corrosion that leads to device failure.

In another embodiment, the FSG layer 15 in the HDP CVD process outlined in FIG. 7 can be replaced with an alternative dielectric layer such as other fluorine containing materials or even non-fluorine containing materials. The extra thickness of USG layer 19 formed in step 130 and the resulting uniform sidewalls that extend above top corners of metal lines to provide improved coverage are not only effective in preventing corrosion from HF or fluorine by-products but also protect underlying metal lines from water and other corrosive agents that may be contained in adjacent dielectric layers.

While this invention has been particularly shown and described with reference to, the preferred embodiments thereof, it will be understood by those skilled in the art that various changes in form and details may be made without departing from the spirit and scope of this invention.

We claim:

1. A method for forming an oxide liner on a substrate comprising:
   (a) providing a substrate with a plurality of metal lines formed thereon;
   (b) forming a first undoped silicate glass (USG) layer on said metal lines, wherein said first USG layer is formed by a plasma comprising oxygen-based gas and silane without RF bias power; and
   (c) forming a second USG layer on said first USG layer, wherein said second USG layer is formed by a plasma comprising oxygen based gas and silane with RF bias power.

2. The method of claim 1 further comprising forming an anti-reflective layer (ARC) comprised of TiN, TaN, TiW, TaSiN, Ti, or silicon oxynitride (SiON) on said metal lines and a silicon rich oxide (SRO) layer on said ARC and on sidewalls of said metal lines before depositing said first USG layer.

3. The method of claim 1 further comprising heating said substrate to a temperature between about 300° C. and 450° C. before depositing said first USG layer and maintaining said temperature during deposition of said first and second USG layers.

4. The method of claim 3 wherein said substrate is heated in a plasma comprising: a top RF power of about 1300 Watts; a side RF power of about 3100 Watts; a chamber pressure of about 6 mTorr; a side Ar flow of about 110 standard cubic centimeters per minute (sccm); a top Ar flow of about 16 sccm; and a side $O_2$ flow of about 126 sccm for a period of about 70 seconds.

5. The method of claim 1 wherein said first USG layer is deposited during a period of about 2 to 10 seconds with a plasma comprising: a chamber pressure between about 3 and 50 mTorr; a top RF power of about 500 to 2000 Watts; a side RF power of about 2000 to 4000 Watts; a side Ar flow from about 20 to 80 sccm; a top Ar flow from about 2 to 20 sccm; a side $O_2$ flow of about 80 to 120 sccm; a side flow of silane of about 20 to 200 sccm; and a top silane flow of about 1 to 10 sccm.

6. The method of claim 1 wherein said first USG layer is deposited during a 3 second period with a plasma comprising: a chamber pressure between about 5 mTorr; a top RF power of about 800 Watts; a side RF power of about 3400 Watts; a side Ar flow of about 40 sccm; a top Ar flow of about 5 sccm; a side $O_2$ flow of about 100 sccm; a side flow of silane of about 40 sccm; and a top silane flow of about 3 sccm.

7. The method of claim 1 wherein the thickness of said first USG layer deposited on said metal lines is between about 30 and 100 Angstroms.

8. The method of claim 1 wherein said second USG layer is deposited during a period of about 2 to 10 seconds with a plasma comprising: a chamber pressure between about 3 and 50 mTorr; a top RF power of about 500 to 2000 Watts; a side RF power of about 2000 to 4000 Watts; a RF bias power between about 500 and 2000 Watts, a side Ar flow from about 20 to 80 sccm; a top Ar flow from about 2 to 20 sccm; a side $O_2$ flow of about 80 to 120 sccm; a side flow of silane of about 20 to 200 sccm; and a top silane flow of about 1 to 10 sccm.

9. The method of claim 1 wherein said second USG layer is deposited for a period of about 3 seconds in a plasma comprising: a chamber pressure of about 5 mTorr; a top RF power of about 800 Watts; a side RF power of about 3400 Watts; a side Ar flow of about 40 sccm; a top Ar flow of about 5 sccm; a side $O_2$ flow of about 100 sccm; a side flow of silane of about 40 sccm; a top silane flow of about 3 sccm; and a RF bias power of about 1200 Watts.

10. The method of claim 1 wherein the thickness of said second USG layer is from about 100 to 500 Angstroms.

11. The method of claim 1 wherein the sputtering component during the deposition of said second USG layer redistributes said first and second USG layers on the sidewalls of said metal lines to form a more uniform sidewall and to provide improved coverage of the top corners of said metal lines.

12. The method of claim 1, further comprising forming a fluorosilicate glass layer on said second USG layer.

13. A high density plasma (HDP) chemical vapor deposition (CVD) method for forming an oxide layer on a metal pattern comprising:
    (a) providing a substrate with metal lines formed thereon, an anti-reflective layer (ARC) on top of said metal lines, and a silicon rich oxide (SRO) layer on top of said ARC and on the sidewalls of said metal lines;
    (b) heating said substrate in a process chamber;
    (c) generating a plasma comprising an inert gas, $O_2$, and silane in said process chamber for depositing a first undoped silicon glass (USG) layer on said SRO layer while an RF bias power is set to 0 for a duration;
    (d) maintaining said plasma in said process chamber for depositing a second USG layer over said first USG layer while said RF bias power is increased to a moderate level; and
    (e) generating a plasma comprising an inert gas, $O_2$, silane, and $SiF_4$ in said chamber to deposit a fluorosilicate glass (FSG) layer.

14. The method of claim 13 wherein said ARC is TiN, TiW, TaSiN, Ti, or SiON.

15. The method of claim 13 wherein said ARC has a thickness of about 200 to 1000 Angstroms and said SRO layer has a thickness of about 100 to 1200 Angstroms.

16. The method of claim 13 wherein said substrate is heated to a temperature in the range of about 300° C. to 450° C. in a plasma comprising: a top RF power of about 1300 Watts; a side RF power of about 3100 Watts; a chamber pressure of about 6 mTorr; a side Ar flow of about 110 sccm. A top Ar flow of about 16 sccm; and a side $O_2$ flow of about 126 sccm for a period of about 70 seconds.

17. The method of claim 13 wherein said deposition of said first USG layer on said SRO layer while an RF bias power is set to 0 for a duration is performed for a period of about 3 seconds in a plasma comprising: a chamber pressure between about 3 and 50 mTorr; a top RF power of about 500 to 2000 Watts; a side RF power of about 2000 to 4000 Watts; a RF bias power between about 500 and 2000 Watts; a side Ar flow from about 20 to 80 sccm; a side flow of silane of about 20 to 200 sccm; and a top silane flow of about 1 to 10 sccm.

18. The method of claim 13 wherein the thickness of said USG layer deposited during the first part of said deposition is between about 30 and 100 Angstroms.

19. The method of claim 13 wherein said second part of the USG deposition is performed for a period of about 3 seconds in a plasma comprising: a chamber pressure between about 3 and 50 mTorr; a top RF power of about 500 to 2000 Watts; a side RF power of about 2000 to 4000 Watts; a RF bias power between about 500 and 2000 Watts; a side Ar flow of about 20 to 80 sccm; a top Ar flow of about 2 to 20 sccm; a side $O_2$ flow of about 80 to 120 sccm; a side flow of silane of about 20 to 200 sccm; and a top silane flow of about 1 to 10 sccm.

20. The method of claim 13 wherein the thickness of the USG layer deposited during the second part of said deposition which contains an RF bias power is between about 100 and 500 Angstroms.

21. The method of claim 13 wherein a sputtering component of said plasma during the second part of said USG deposition redistributes the USG layer to form a more uniform sidewall and a better coverage of top corners of said metal lines.

22. The method of claim 13 wherein said FSG layer is deposited by a process comprising a first short interval wherein $SiF_4$ is flowed at a low flow rate and a second longer interval having the same conditions as said first short interval except that $SiF_4$ is flowed at a higher rate and a RF bias power is increased slightly.

23. The method of claim 22 wherein the FSG deposition during said first interval is performed for a period of about 3 seconds in the same process chamber used to deposit said USG layer with a chamber pressure of about 3 and 50 mTorr; a top RF power of about 500 to 2000 Watts; a side RF power of about 2000 to 4000 Watts; a RF bias power between about 2000 and 3000 Watts; a side Ar flow of about 20 to 80 sccm; a top Ar flow of about 2 to 20 sccm; a side $O_2$ flow of about 80 to 120 sccm; a side flow of silane of about 20 to 200 sccm; and a top silane flow of about 1 to 10 sccm and a side $SiF_4$ flow of about 5 sccm.

24. The method of claim 22 wherein the FSG deposition during said second interval is performed for a period of about 110 seconds with a side $SiF_4$ flow rate in a range of about 20 to 40 sccm and a RF bias power in the range of about 2000 to 3000 Watts.

25. The method of claim 22 wherein an FSG layer having a thickness between about 4000 and 20000 Angstroms is deposited.

* * * * *